United States Patent
Sawai et al.

(10) Patent No.: US 9,196,563 B2
(45) Date of Patent: Nov. 24, 2015

(54) BONDED BODY AND SEMICONDUCTOR MODULE

(71) Applicant: Hitachi, Ltd., Chiyoda-ku, Tokyo (JP)

(72) Inventors: Yuichi Sawai, Tokyo (JP); Takashi Naito, Tokyo (JP); Takuya Aoyagi, Tokyo (JP); Tadashi Fujieda, Tokyo (JP); Mutsuhiro Mori, Tokyo (JP)

(73) Assignee: Hitachi, Ltd., Tokyo (JP)

(*) Notice: Subject to any disclaimer, the term of this patent is extended or adjusted under 35 U.S.C. 154(b) by 0 days.

(21) Appl. No.: 14/374,396

(22) PCT Filed: Nov. 21, 2012

(86) PCT No.: PCT/JP2012/080121
§ 371 (c)(1),
(2) Date: Jul. 24, 2014

(87) PCT Pub. No.: WO2013/111434
PCT Pub. Date: Aug. 1, 2013

(65) Prior Publication Data
US 2015/0008573 A1 Jan. 8, 2015

(30) Foreign Application Priority Data
Jan. 26, 2012 (JP) ................................. 2012-013663

(51) Int. Cl.
*H01L 23/34* (2006.01)
*H01L 23/373* (2006.01)
(Continued)

(52) U.S. Cl.
CPC ............ *H01L 23/3736* (2013.01); *B23K 35/26* (2013.01); *C04B 37/025* (2013.01);
(Continued)

(58) Field of Classification Search
CPC ... H01L 23/3736; H01L 24/32; H01L 33/641; H01L 33/62; H01L 23/3731; H01L 2924/014; H01L 2924/01047; H01L 2924/01082; H01L 2924/1432; H01L 2224/32245
See application file for complete search history.

(56) References Cited

U.S. PATENT DOCUMENTS 4,945,071 A  7/1990 Friesen et al.
5,188,990 A * 2/1993 Dumesnil et al. ............... 501/19
(Continued)

FOREIGN PATENT DOCUMENTS

CN  101781090 A  7/2010
JP  2-293344 A  12/1990
(Continued)

OTHER PUBLICATIONS
International Search Report (PCT/ISA/210) dated Feb. 26, 2013, with English Translation (Seven (7) pages).
(Continued)

*Primary Examiner* — Ahmed Sefer
(74) *Attorney, Agent, or Firm* — Crowell & Moring LLP

(57) ABSTRACT

Bondability and heat conductivity of a bonded body in which some of metal, ceramic, or semiconductor are bonded to each other are improved. In the bonded body in which a first member and a second member each comprise one of metal, ceramic, or semiconductor are bonded to each other, the second member is bonded to the first member by way of an adhesive member disposed to the surface of the first member, and the adhesive member contains a $V_2O_5$-containing glass and metal particles. In a semiconductor module having a base metal, a ceramic substrate, a metal wiring, and a semiconductor chip, the ceramic substrate is bonded to the base metal by way of a first adhesive member disposed to the surface of the base metal, the metal wiring is bonded to the ceramic substrate by way of a second adhesive member disposed to the surface of the ceramic substrate, the semiconductor chip is bonded to the metal wiring by way of a third adhesive member disposed to the surface of the metal wiring, and the first adhesive member, the second adhesive member, and the third adhesive member each comprise a $V_2O_5$-containing glass and metal particles.

12 Claims, 5 Drawing Sheets

(51) Int. Cl.

| | |
|---|---|
| *B23K 35/26* | (2006.01) |
| *H01L 23/00* | (2006.01) |
| *C04B 37/02* | (2006.01) |
| *C22C 13/00* | (2006.01) |
| *H01L 21/52* | (2006.01) |
| *H01L 33/62* | (2010.01) |
| *H01L 33/64* | (2010.01) |
| *C22C 5/06* | (2006.01) |

(52) U.S. Cl.
CPC ............... *C04B37/026* (2013.01); *C22C 5/06* (2013.01); *C22C 13/00* (2013.01); *H01L 21/52* (2013.01); *H01L 23/3735* (2013.01); *H01L 24/32* (2013.01); *H01L 24/34* (2013.01); *H01L 33/62* (2013.01); *H01L 33/641* (2013.01); *C04B 2235/96* (2013.01); *C04B 2235/9607* (2013.01); *C04B 2237/10* (2013.01); *C04B 2237/12* (2013.01); *C04B 2237/125* (2013.01); *C04B 2237/366* (2013.01); *C04B 2237/368* (2013.01); *C04B 2237/408* (2013.01); *H01L 23/3731* (2013.01); *H01L 2224/32245* (2013.01); *H01L 2224/48091* (2013.01); *H01L 2224/48227* (2013.01); *H01L 2224/48228* (2013.01); *H01L 2224/48464* (2013.01); *H01L 2224/73221* (2013.01); *H01L 2224/73265* (2013.01); *H01L 2924/014* (2013.01); *H01L 2924/01047* (2013.01); *H01L 2924/01082* (2013.01); *H01L 2924/1432* (2013.01); *H01L 2924/15747* (2013.01); *H01L 2924/15787* (2013.01); *Y10T 428/12014* (2015.01)

(56) References Cited

U.S. PATENT DOCUMENTS

| | | | |
|---|---|---|---|
| 2004/0217455 A1* | 11/2004 | Shiono et al. | 257/678 |
| 2004/0217486 A1* | 11/2004 | Walter et al. | 257/779 |
| 2010/0180934 A1 | 7/2010 | Naito et al. | |
| 2012/0139133 A1* | 6/2012 | Takahashi | 257/794 |

FOREIGN PATENT DOCUMENTS

| | | | |
|---|---|---|---|
| JP | 5-175254 A | | 7/1993 |
| JP | 8-107166 | * | 4/1996 |
| JP | 8-259262 A | | 10/1996 |
| JP | 2010-184852 A | | 8/2010 |
| JP | 2011-251329 A | | 12/2011 |
| JP | 2012-96993 A | | 5/2012 |
| JP | 2013-32255 A | | 2/2013 |
| WO | WO 2012/020694 A1 | | 2/2012 |

OTHER PUBLICATIONS

U.S. Appl. No. 14/177,988, filed on Feb. 11, 2014.
U.S. Appl. No. 14/178,847, filed on Feb. 12, 2014.
Chinese Office Action dated Jun. 3, 2015 (11 pages)

\* cited by examiner

LIGHT EMISSION

HEAT DISSIPATION

FIG. 6
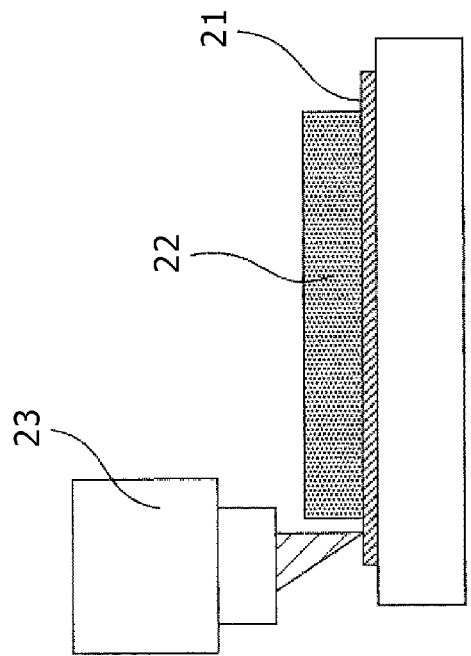
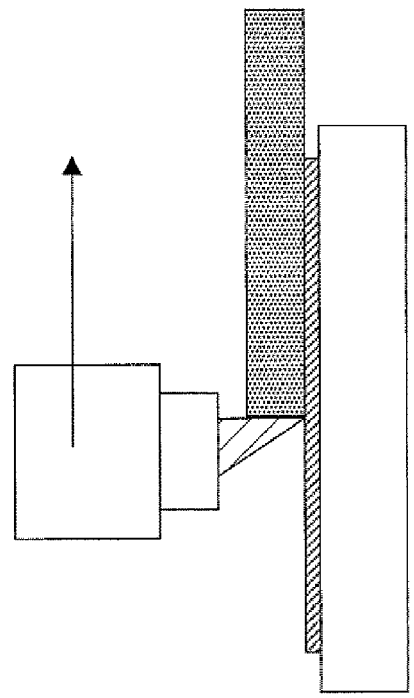

BONDED BODY AND SEMICONDUCTOR MODULE

TECHNICAL FIELD

The present invention relates to an adhesive member for bonding a metal, a ceramic, and a semiconductor, and a semiconductor module using the same.

BACKGROUND ART

A semiconductor module is generally manufactured by bonding a ceramic substrate to a base metal, bonding a metal wiring to the ceramic substrate, and bonding an element such as a semiconductor chip to the metal wiring. An adhesive used for bonding is referred to herein as a die bonding material. Solder bonding has been mainly used so far for the bonding of the elements in power devices. However, in view of the requirement for disuse of lead, conductive pastes formed by mixing Ag powder and resin and, lead-free solders have been used as substitute materials.

In the bonding of semiconductor chips, since semiconductor elements such as semiconductor chips have tended to be integrated and refined more, the amount of heat generated per unit area has tended to be accordingly increased. To deal with this problem, semiconductor modules having semiconductor elements mounted thereon need to efficiently dissipate heat generated from the semiconductor elements to the outside. There is a subject of improving the heat conductivity of die bonding materials.

In the bonding of a ceramic substrate, a ceramic substrate mainly comprising AlN or $Si_3O_4$ is first metallized. Then, the metallized layer and a semiconductor chip, or the metallized layer and a base metal are bonded to each other by means of a lead-free solder. It is required for a method of forming a strong metallized layer, moderation of difference of heat expansion coefficient between the substrate and the semiconductor chip, improvement in the heat dissipation of the substrate, and long time reliability of such as heat cycle resistance.

Patent Document 1 describes a lead-free solder paste. There is provided a lead-free solder paste containing a Bi solder powder and a Cu metal powder and having a heat conductivity of 52 W/mK.

PRIOR ART DOCUMENTS

Patent Document

Patent Document 1: JP-2011-251329-A

SUMMARY OF THE INVENTION

Problem to be Solved by the Invention

However, bondability between a ceramic substrate and a metal wiring is lowered in the lead-free solder unless the ceramic substrate is previously metallized. Further, when the lead-free solder is used for bonding the metal wiring and the semiconductor chip, heat conductivity is lowered.

The present invention intends to improve the bondability and the heat conductivity of a bonded body in which some of a metal, a ceramic, and a semiconductor is bonded.

Means for Solving the Problem

For attaining the purpose, the present invention provides a bonded body formed by bonding a first member and a second member each comprising one of a metal, a ceramic, and a semiconductor, characterized in that the second member is bonded to the first member by way of an adhesive member disposed to the surface of the first member, and the adhesive member contains a $V_2O_5$-containing glass and metal particles.

Further, a ceramic module having a base metal, a ceramic substrate, a metal wiring and a ceramic chip is characterized in that the ceramic substrate is bonded to the base metal by way of a first adhesive member disposed on the surface of the base metal, the metal wiring is bonded to the ceramic substrate by way of a second adhesive member disposed on the surface of the ceramic substrate, the semiconductor chip is bonded to the metal wiring by way of a third adhesive member disposed on the surface of the metal wiring, and the first adhesive member, the second adhesive member, and the third adhesive member each contain a $V_2O_5$-containing glass and metal particles.

Effect of the Invention

According to the present invention, the bondability and the heat conductivity can be improved.

BRIEF DESCRIPTION OF THE DRAWINGS

FIG. 6 is a schematic view of a die shear strength test.

MODES FOR CARRYING OUT THE INVENTION

Figure 1:
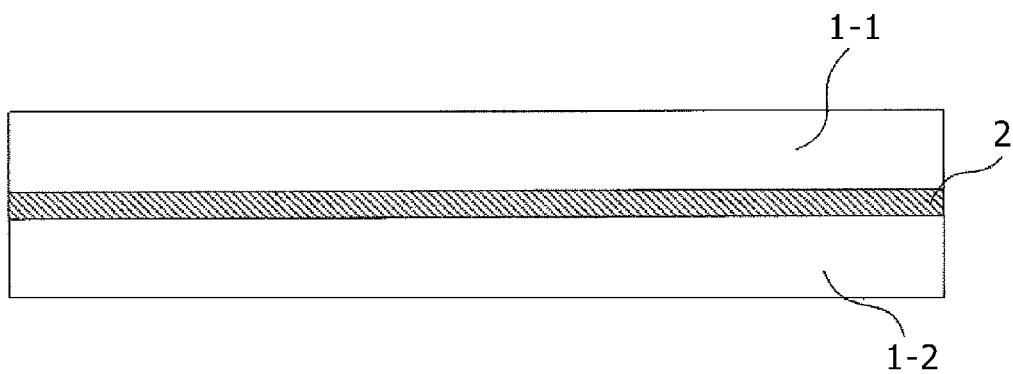
FIG. 1 is a structural cross sectional view of a bonded body.

The present invention relates to a bonded body in which members each comprising a metal, a ceramic, or a semiconductor (first member 1-1, second member 1-2) are bonded to each other as illustrated in FIG. 1, and an adhesive member 2 that bonds the two members contains a glass and metal particles. It is on the premise that vanadium oxide ($V_2O_5$) is contained in the glass that can be bonded to any of the metal, the ceramic, or the semiconductor. The thickness in the vertical direction of the drawing may not always be uniform at any position within the plane of the member. Further, it is not always necessary that the adhesive member 2 is bonded with the entire surface of both of the members on the side where they are bonded to each other and, on the contrary, it may protrude from both of the members. In short, it may suffice that the adhesive member 2 is formed in a layered form and adhered between the first member 1-1 and the second member 1-2.

When electric current is supplied to provide such an operation state that temperature difference is caused between the first member 1-1 and the second member 1-2, the bonded body of the invention not only bonds both of the members but also can transfer heat from a member on the side at a high temperature to a member on the side at a low temperature in both of the members. Accordingly, when the first member 1-1 is a heat generation body and the second member 1-2 is a heat dissipation body, heat can be dissipated from the first member 1-1 by way of the adhesive member 2 to the second member 1-2.

It is on the premise that the adhesive member 2 is supplied and used as a paste. The bonded body is obtained by coating, drying and then calcining a paste thereby removing organic ingredients. Then the members are bonded to each other by way of main sintering step. Accordingly, glass is preferably less crystalline than amorphous and, the degree of crystallization is preferably 30% or less in order to reproduce good fluidity.

For preventing crystallization of glass as much as possible, the content of $TeO_2$ is at least 15 mass % or more. Further, BaO and $WO_3$ are added in order to prevent crystallization of the glass. Specifically, the glass comprises 35 to 55 mass % of $V_2O_5$, 15 to 35 mass % of $TeO_2$, 4 to 20 mass % of $P_2O_5$, and 5 to 30 mass % of one or more of $Fe_2O_3$, $WO_3$, $MoO_3$, $MnO_2$, $Sb_2O_3$, $Bi_2O_3$, BaO, $K_2O$, and ZnO.

Further, for lowering a glass softening point, the content of $TeO_2$ is at least 15 mass % or more and $Ag_2O$ is used as the other ingredient. Specifically, the glass contains 10 to 60 mass % of $Ag_2O$, 5 to 65 mass % of $V_2O_5$, and 15 to 50 mass % of $TeO_2$. The softening point can be lowered more as the content of $Ag_2O$ is increased within the range of the composition described above.

For providing the adhesive member with a heat conductivity, metal particles not reacting with the vanadium oxide-containing glass are mixed. The metal particles constituting the adhesive member comprise at least one of Ag or an Sn-containing solder and account for 30 to 95 vol % of the adhesive member.

The metal particles constituting the adhesive member comprise Ag and account for 60 to 95 vol % of the adhesive member.

Figure 2:
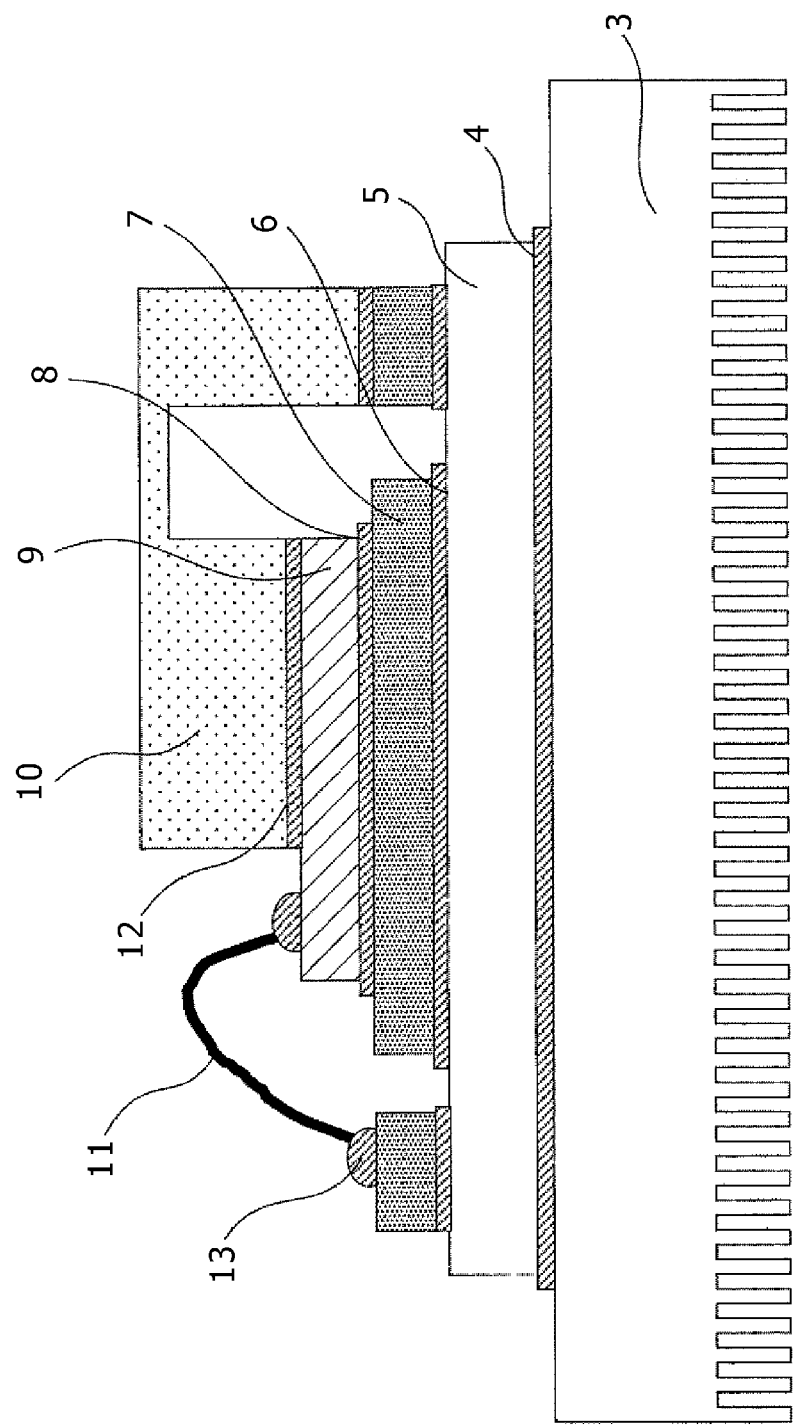
FIG. 2 is a structural cross sectional view of a semiconductor module.

One of the embodiments applied with the invention is a semiconductor module and, as illustrated in FIG. 2, has an insulation layer 5 such as a ceramic substrate bonded to the base metal 3 by way of a first adhesive layer 4 over the upper surface of a base metal 3, a metal wiring 7 bonded to the insulation layer 5 by way of a second adhesive layer 6 over the upper surface of the insulation layer 5, and a semiconductor chip 9 bonded to the metal wiring 7 by way of a third adhesive layer 8 over the metal wiring 7. A metallized layer is not present at the boundary between the insulation layer 5 and the first and second adhesive layers, and the first, second, and third adhesive layers each contain a vanadium oxide glass and metal particles. The insulation layer 5 includes, for example, a ceramic substrate of high heat conductivity comprising AlN, $Si_3N_4$, etc.

That is, the semiconductor module of the invention includes the first, second, and third adhesive layers and the invention can be naturally applied only to one of the first, second, and third adhesive layers.

The adhesive member may be just interposed between the members to be bonded to each other. For the members to be bonded to each other, the drawing is shown such that the area of the adhesive member is larger than the area of the member to be bonded having a smaller area of bonding (metal wiring 7 for the insulation layer 5 and the metal wiring 7, semiconductor chip 9 for the metal wiring 7 and the semiconductor chip 9), but the area of the adhesive member may be smaller than the area of the member having the smaller bonding surface. Further, each of the members may be just in contact with the adhesive member at least at one surface, but the adhesive layer may also extend to plural surfaces, for example, lateral sides, by which the members can be bonded to each other more strongly.

The semiconductor module includes, for example, a power device, which may sometimes be disposed to a place where large vibrations or long time vibrations are applied, or a place exposed to high temperature. Accordingly, it is necessary that members are bonded firmly to each other. In the invention, since the softened vanadium oxide glass is firmly bonded and solidified at a high wettability with each of the parts, it can firmly bond each of the base metal 3, the insulation layer 5, the metal wiring 7, and the semiconductor chip 9. Accordingly, even when the ceramics are contained in components, bondability between parts each other can be improved with no metallizing treatment.

Further, it is necessary for the adhesive member used for the semiconductor module that the member can dissipate heat through the bonded portion. Accordingly, metal particles are incorporated in the adhesive member of the invention to enhance the heat conductivity of the adhesive.

It is on the premise that the glass contained in the adhesive member contains $V_2O_5$. Specifically, the glass comprises 35 to 55 mass % of $V_2O_5$, 15 to 35 mass % of $TeO_2$, 4 to 20 mass % of $P_2O_5$, and 5 to 30 mass % of one or more of $Fe_2O_3$, $WO_3$, $MoO_3$, $MnO_2$, $Sb_2O_3$, $Bi_2O_3$, BaO, $K_2O$, and ZnO. Since the glass of such a compositional range has a glass transition point of 330° C. or lower and is softened sufficiently even at a temperature of 500° C. or lower, the glass can be satisfactorily bonded to any of the base metal 3, the insulation layer 5, the metal wiring 7, and the semiconductor chip 9.

Since glass generally comprises oxides, when the metal particles are mixed and heated, the metal particles are oxidized in most of cases. Also in the vanadium oxide glass according to the invention, when it is mixed with a metal powder such as of Cu, Fe and Al and heated, the metal powder is oxidized. On the other hand, Ag is known as a less oxidized metal and it is not oxidized even when heated in admixture with the vanadium oxide glass according to the invention and heated. In addition, the present inventors have found that even when an Sn-type lead-free solder (Sn—Ag—Cu type solder or Sn—Cu—Ni type solder) powder and the vanadium oxide glass are mixed and heated, the solder is scarcely oxidized.

The metal particles preferably contain at least one of Ag or an Sn-containing solder (Sn—Ag—Cu type solder). Since Ag or the Sn-containing solder is less oxidized even when mixed with the vanadium oxide glass, the heat conductivity is less lowered when the adhesive member is formed. Generally, since the second adhesive member 6 is not required to have electric conductivity, it may be also an Sn-containing solder powder instead of Ag which is a good electric conductor, or both of them may be mixed. Further, the metal particles may preferably account for 30 to 95 vol % of the second adhesive member 6. With such a configuration, the insulation layer 5 and the metal wiring 7 can be satisfactorily bonded to each other and an appropriate heat conductivity can be provided. Further, when the metal particles account for 60 to 95 vol % of the second adhesive member 6, the heat conductivity is further improved and generated heat from the semiconductor chip 9 can be dissipated more rapidly.

Further, the glass may also contain 10 to 60 mass % of $Ag_2O$, 5 to 65 mass % of $V_2O_5$, and 15 to 50 mass % of $TeO_2$. With such a compositional range, a glass transition point can be further lowered to 250° C. or lower and sufficient thermal stability can be ensured and the glass can be satisfactorily bonded to any of the base metal 3, the insulation layer 5, the metal wiring 7, and the semiconductor chip 9 even at a temperature of 400° C. or lower.

A semiconductor module in which the invention is applied only to the third adhesive layer 8 has a semiconductor chip 9 bonded to the metal wiring 7 by way of the third adhesive layer 8 over the metal wiring 7. The third adhesive member 8 contains a vanadium oxide glass and metal particles. The metal particles comprise Ag in this case and account for 60 to 95 vol % of the third adhesive member. With such a configuration, the metal wiring 7 and the semiconductor chip 9 can be satisfactorily bonded to each other, and high heat conductivity and low electric resistivity can be provided.

Further, as illustrated in FIG. 2, the adhesive member of the invention can be used when the semiconductor chip 9 and the metal wiring 7 are connected by way of metal members 10 and 11. That is, in the semiconductor module of the configuration described above, the semiconductor chip 9 and the metal wiring 7 are connected by way of a fourth adhesive member 12 and the fifth adhesive member 13 by the metal members 10 and 11. The metal particle comprise Ag and account for 60 to 95 vol % of the fourth adhesive member. With such a configuration, the metal wiring 7 and the semiconductor chip 9 can be satisfactorily bonded to each other, and high heat conductivity and low electric resistivity can be provided.

The composition of the vanadium oxide glass of the third adhesive member 8, the fourth adhesive member 12, and the fifth adhesive member 13 can be similar to that of the second adhesive member 6.

Figure 3:
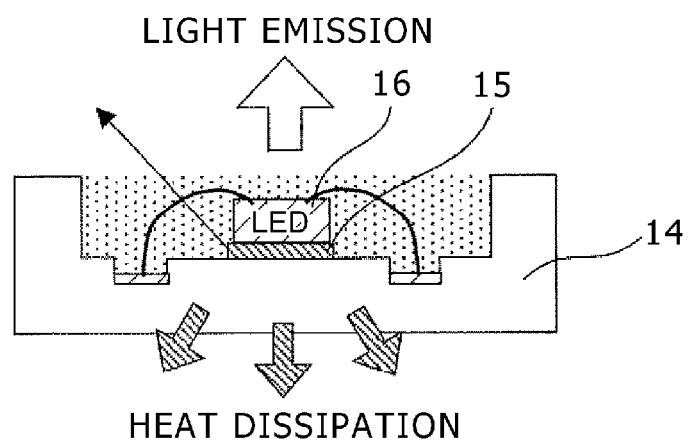
FIG. 3 is a structural cross sectional view of an LED illumination device.

FIG. 3 illustrates a structural cross sectional view of an LED illumination device as other embodiment of the invention. The LED illumination device has an emission module in which an LED emission element 16 is bonded to a substrate 14 by way of an adhesive member 15, and a power source circuit portion (not illustrated) for supplying a power to the emission module. The adhesive member 15 is similar to that of the semiconductor module described above.

Since the LED emission element tends to be thermally deteriorated, heat generated by light emission has to be dissipated rapidly to the outside. For this purpose, by adopting a configuration of using Ag for the metal particles that account for 60 to 95 vol % of the adhesive member, the substrate and the LED emission element can be satisfactorily bonded to each other and high heat conductivity can be provided.

Figure 4:
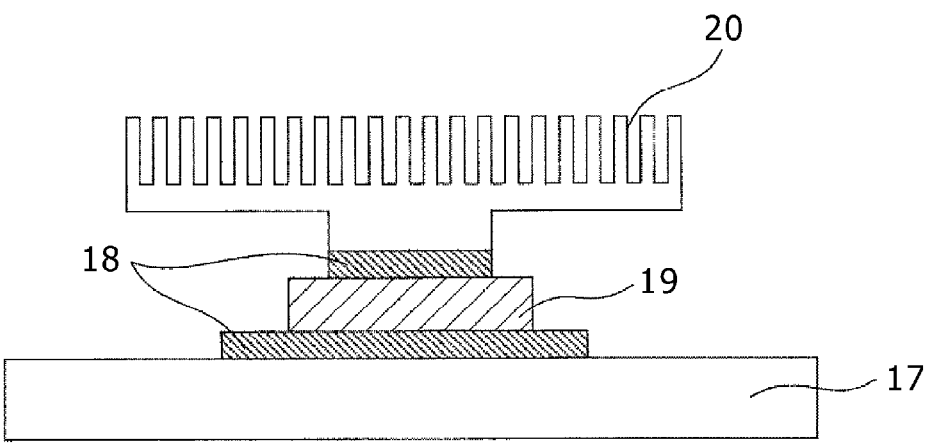
FIG. 4 is a structural cross sectional view of a semiconductor device.

FIG. 4 illustrates a semiconductor device such as a mother board of a personal computer as a further embodiment of the invention. The semiconductor device has a microcomputer IC in which a CPU 19 is connected to a heat sink 20 by way of an adhesive member 18 over a substrate 17. The adhesive member 18 is similar to that of the semiconductor module described above.

More specifically, glass contained in the adhesive member 18 comprises 35 to 55 mass % of $V_2O_5$, 15 to 35 mass % of $TeO_2$, 4 to 20 mass % of $P_2O_5$, and 5 to 30 mass % of one or more of $Fe_2O_3$, $WO_3$, $MoO_3$, $MnO_2$, $Sb_2O_3$, $Bi_2O_3$, BaO, $K_2O$, and ZnO. Since glass having such a compositional range has a glass transition point of 330° C. or lower and is softened sufficiently even at a temperature of 500° C. or lower, it can satisfactorily bond the substrate and the LED emission element, the CPU, the heat sink, etc. even at a temperature of 500° C. or lower.

Alternatively, the glass has a feature in comprising 10 to 60 mass % of $Ag_2O$, 5 to 65 mass % of $V_2O_5$, and 15 to 50 mass % of $TeO_2$. With such a compositional range, the glass transition point can be lowered to 250° C. or lower and, at the same time, a sufficient thermal stability can be ensured, and the glass can satisfactorily bond the substrate and the LED emission element, or the CPU and the heat sink, etc. at a temperature of 400° C. or lower.

EXAMPLE 1

In this example, vanadium oxide glasses having various compositions were prepared and the softening point and the moisture resistance of the glasses were investigated.
(Preparation of Glass)

Glasses having compositions shown in Table 1 (VTC2-01 to 03 and VTC3-01 to 03) were prepared. The compositions in the table are shown by the mass ratio of respective ingredients in terms of oxide conversion. As the starting material, an oxide powder manufactured by Kojundo Chemical Laboratory Co., Ltd. (99.9% purity) was used. For some samples, $Ba(PO_3)_2$ (barium phosphate manufactured by Rasa Industries, Ltd.) was used as a Ba source and a P source.

Respective starting material powders were mixed at the mass ratios shown in Table 1 and 200 g of a powder mixture in total was placed in a crucible. In this case, a platinum crucible was used when the $Ag_2O$ ratio in the starting material was 40 mass % or less and an alumina crucible was used when the ratio was 40 mass % or more. Upon mixing, the starting powders were mixed in the crucible by using a metal spoon so as to avoid excess moisture absorption to the powders.

The crucible containing the starting powder mixture was put in a glass melting furnace to perform heating and melting. Temperature was elevated at a temperature elevation rate of 10° C./min and a molten glass was kept under stirring for one hour at a set temperature (700 to 900° C.). Then, the crucible was taken out of the glass melting furnace and the glass was cast into a graphite casting mold previously heated to 150° C. Then, the cast glass was transferred to a strain relieving furnace heated preliminarily to a strain relieving temperature and, after relieving strain by keeping for one hour, cooled to a room temperature at a rate of 1° C./min. The glass cooled to the room temperature was pulverized to prepare a glass powder having the composition shown in the table.
(Evaluation of Softening Point)

Figure 5:
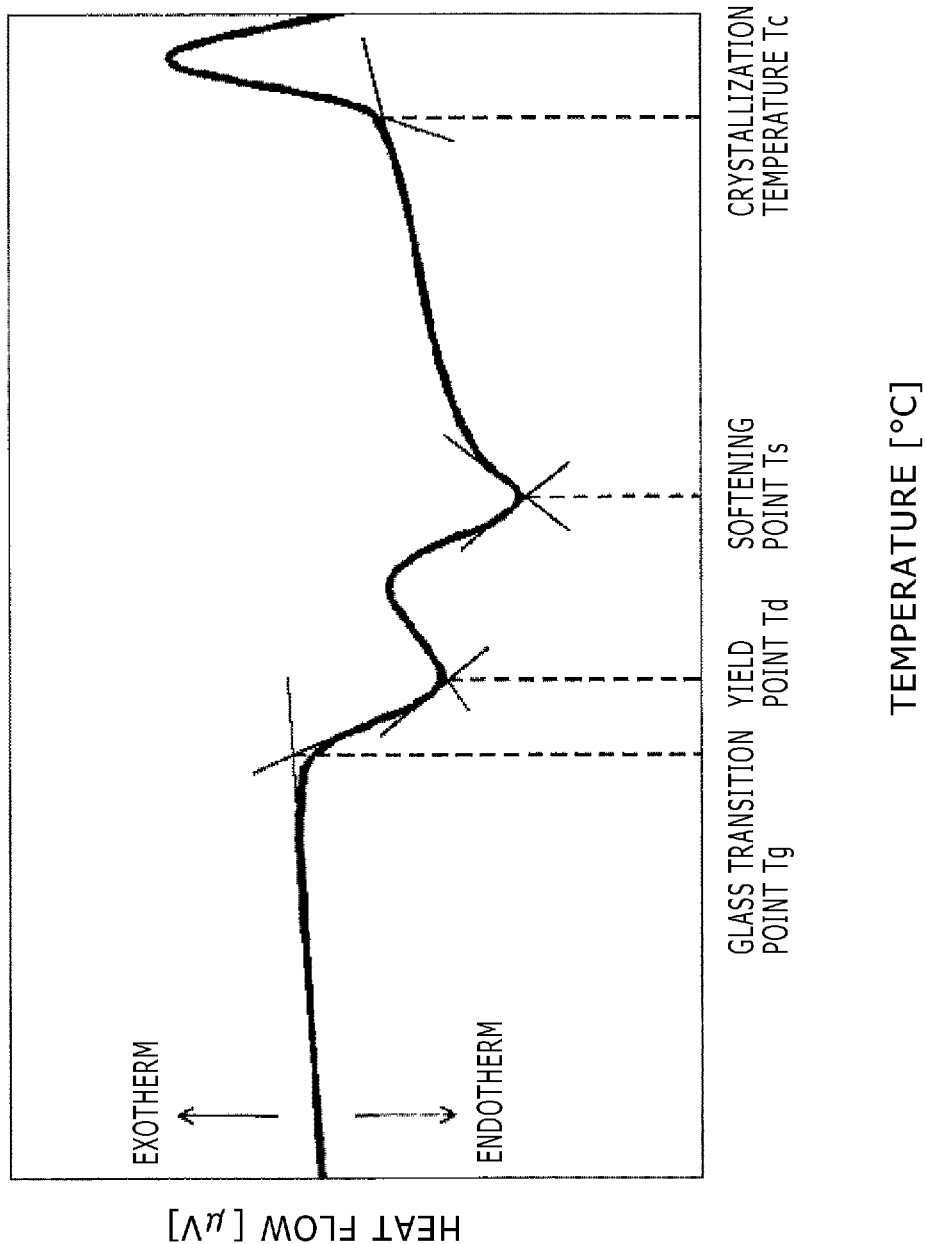
FIG. 5 is a DTA curve of glass.

Characteristic temperature was measured by differential thermal analysis (DTA) on each of the glass powders obtained as described above. DTA measurement was performed by setting the mass of a reference sample (α-alumina) and samples to be measured each to 650 mg and at a temperature elevation rate of 5° C./min in an atmospheric air. In this example, a second endothermic peak temperature of a glass DTA curve was defined as a softening point Ts (refer to FIG. 5). The result is also shown together in Table 1.

TABLE 1

| | Composition table (mass %) | | | | | | | | Characteristic temperature (° C.) | | | | | | | |
|---|---|---|---|---|---|---|---|---|---|---|---|---|---|---|---|---|
| Sample | $V_2O_5$ | $Ag_2O$ | $Te_2O$ | $P_2O_5$ | BaO | $WO_3$ | $Sb_2O_3$ | $Fe_2O_3$ | Tg | Mg | Ts | Tsint | Tf | Tw | Tcry | Tcry-p |
| VTC2-01 | 47 | | 30 | 13 | | | | 10 | 293 | 314 | 364 | 374 | 390 | 405 | >550 | >550 |
| VTC2-02 | 55 | | 20 | 10 | 5 | | 10 | | 313 | 335 | 378 | 397 | 413 | 429 | 475 | 515 |
| VTC2-03 | 40 | | 20 | 15 | | 15 | | 10 | 327 | 350 | 401 | 413 | 430 | 446 | 524 | 554 |
| VTC3-01 | 17 | 38 | 30 | 4.8 | 5.2 | 5 | | | 197 | 214 | 260 | 268 | 286 | 296 | non | non |
| VTC3-02 | 20 | 45 | 35 | | | | | | 163 | 172 | 208 | 216 | 227 | 234 | 263 | 294 |
| VTC3-03 | 18 | 43 | 34 | 5 | | | | | 167 | 183 | 221 | | 231 | | 241 | 260 |

EXAMPLE 2

In this example, bonding between the ceramic substrates comprising, for example, AlN or $Si_3N_4$ and metal materials was investigated.

Bonded samples were manufactured by the following procedures using glass VTC2-01 prepared in Example 1. At first, VTC2-01 was pulverized into a fine powder of an average particle diameter of 0.5 μm or less. The pulverized VTC2-01 and an Ag powder or an Sn—Ag—Cu type solder powder were blended at a predetermined ratio and mixed for 15 minutes in a mortar to prepare a powder mixture.

(Heat Conductivity)

Various kinds of powder mixtures were formed each into a molded body of 10 mm diameter and 2 mm thickness by using a mold. The prepared molded body was sintered in atmospheric air for 450° C.×30 min by using an electric muffle furnace to manufacture simulation samples for evaluating the heat conductivity of a first adhesive layer. The thus manufactured sintered samples were used and a heat conductivity was measured by a xenon flash method. The xenon flash method is a method of applying a pulsed light to one surface of a simulation sample and measuring the heat diffusion rate due to change of temperature with time at a rear face, and calculating the heat conductivity based thereon. Heat conductivities of the respective samples are shown collectively in Table 2.

Subsequently, each of the powder mixtures, a resin binder, and a solvent were mixed, they were kneaded in an automatic kneader (Awatori Rentaro), to prepare a die bonding material paste. Ethylcellulose was used as the resin binder and butyl carbitol acetate was used as the solvent. The bonding strength was evaluated by the method shown below by using the die bonding material paste prepared as described above.

(Bonding Strength)

A die bonding material paste was printed over a ceramic substrate in a range of 5×5 $mm^2$, dried at 150° C., and then temporarily calcined in atmospheric air at 450° C.×30 minutes. Subsequently, each of Cu, Al, and AlSiC plates cut into 4×4 $mm^2$ was placed over the die bonding material, and a 100 g weight was placed thereon and sintered in atmospheric air for 450° C.×30 minutes.

As described above, die shear test samples in each of which the metal plate was bonded over the ceramic substrate were manufactured. The bonding strength between the metal plate and the ceramic substrate was evaluated by a die shear strength test. The die shear strength test is a test method, as illustrated in FIG. 6 of pressing a metal plate 18 bonded over a substrate by way of an adhesive member 17 in a horizontal direction by an exclusively used jig 19 from the lateral side and measuring a load value at which the metal plate was peeled from the substrate, that is, a shear strength of the metal plate (die shear strength: N). Table 2 shows the result of evaluation in a case of using an AlN substrate as a ceramic substrate and Table 3 collectively shows the result of evaluation in a case of using an $Si_3N_4$ substrate. In this example, samples having a bonding strength >20 MPa and a heat conductivity >10 W/mK were evaluated as satisfactorily.

As can be seen from the tables, it was shown that the die bonding material of the example can bond the metal plate to the ceramic substrate not having a metallized layer at high heat conductivity and high bonding strength.

TABLE 2

| Sample No. | Powder mixture | Glass mixing amount (vol %) | Heat conductivity (W/mK) | Bondability with AlN substrate (Shear strength/Mpa) | | | Overall evaluation |
|---|---|---|---|---|---|---|---|
| | | | | Cu | Al | AlSiC | |
| spl-2-1 | Ag | 75 | 8.5 | 17.3 | 17.9 | 16.9 | Bad |
| spl-2-2 | Ag | 70 | 19.5 | 16.4 | 16.9 | 16.0 | Good |
| spl-2-3 | Ag | 50 | 38.3 | 14.8 | 15.2 | 14.4 | Good |
| spl-2-4 | Ag | 25 | 130 | 13.8 | 13.5 | 13.9 | Good |
| spl-2-5 | Ag | 10 | 162.2 | 13.2 | 13.1 | 13.0 | Good |
| spl-2-6 | Ag | 3 | 298.4 | 6.1 | 6.2 | 6.0 | Bad |
| spl-2-7 | $Sn_3Ag_4Cu$ | 60 | 10.2 | 15.8 | 16.2 | 15.5 | Good |
| spl-2-8 | $Sn_3Ag_4Cu$ | 50 | 19.6 | 14.7 | 15.1 | 14.4 | Good |
| spl-2-9 | $Sn_3Ag_4Cu$ | 25 | 45.8 | 11.4 | 11.7 | 11.2 | Good |
| spl-2-10 | $Sn_3Ag_4Cu$ | 10 | 52.3 | 10.0 | 10.3 | 9.9 | Good |
| spl-2-11 | $Sn_3Ag_4Cu$ | 3 | 58.7 | 9.0 | 9.2 | 8.9 | Bad |
| spl-2-12 | $Sn_3Ag_{0.5}Cu$ | 60 | 10 | 16.1 | 16.5 | 15.7 | Good |
| spl-2-13 | $Sn_3Ag_{0.5}Cu$ | 50 | 17.2 | 13.9 | 14.2 | 13.6 | Good |
| spl-2-14 | $Sn_3Ag_{0.5}Cu$ | 25 | 38.5 | 10.9 | 11.2 | 10.7 | Good |
| spl-2-15 | $Sn_3Ag_{0.5}Cu$ | 10 | 48.2 | 10.2 | 10.4 | 10.0 | Good |
| Comparative Example | Commercial Bi type solder | | 35.6 | 0.02* | 0.04 | 0.01 | Bad |

*With no metallized layer

TABLE 3

| Sample No. | Powder mixture | Glass mixing amount (vol %) | Bondability with $Si_3N_4$ substrate (Shear strength/Mpa) | | | Overall evaluation |
|---|---|---|---|---|---|---|
| | | | Cu | Al | AlSiC | |
| spl-2-1 | Ag | 75 | 19.5 | 20.1 | 19.1 | Bad |
| spl-2-2 | Ag | 70 | 18.6 | 19.1 | 18.2 | Good |
| spl-2-3 | Ag | 50 | 17.0 | 17.4 | 16.6 | Good |
| spl-2-4 | Ag | 25 | 16.0 | 15.7 | 16.1 | Good |
| spl-2-5 | Ag | 10 | 15.4 | 15.3 | 15.2 | Good |
| spl-2-6 | Ag | 3 | 8.3 | 8.4 | 8.2 | Bad |
| spl-2-7 | $Sn_3Ag_4Cu$ | 60 | 18.0 | 18.4 | 17.7 | Good |
| spl-2-8 | $Sn_3Ag_4Cu$ | 50 | 16.9 | 17.3 | 16.6 | Good |
| spl-2-9 | $Sn_3Ag_4Cu$ | 25 | 13.6 | 13.9 | 13.4 | Good |
| spl-2-10 | $Sn_3Ag_4Cu$ | 10 | 12.2 | 12.5 | 12.1 | Good |
| spl-2-11 | $Sn_3Ag_4Cu$ | 3 | 9.5 | 9.2 | 8.9 | Bad |
| spl-2-12 | $Sn_3Ag_{0.5}Cu$ | 60 | 18.3 | 18.7 | 17.9 | Good |

TABLE 3-continued

| Sample No. | Powder mixture | Glass mixing amount (vol %) | Bondability with Si₃N₄ substrate (Shear strength/Mpa) | | | Overall evaluation |
|---|---|---|---|---|---|---|
| | | | Cu | Al | AlSiC | |
| spl-2-13 | Sn₃Ag₀.₅Cu | 50 | 16.1 | 16.4 | 15.8 | Good |
| spl-2-14 | Sn₃Ag₀.₅Cu | 25 | 13.1 | 13.4 | 12.9 | Good |
| spl-2-15 | Sn₃Ag₀.₅Cu | 10 | 12.4 | 12.6 | 12.2 | Good |
| Comparative Example | Commercial Bi type solder | | 0.02* | 0.04 | 0.01 | Bad |

*With no metallized layer

TABLE 4

| Sample No. | Powder mixture | Glass mixing amount (vol %) | Heat conductivity (W/mK) | Electric resistivity (Ω·cm) | Shear strength (Mpa) | Overall evaluation |
|---|---|---|---|---|---|---|
| spl-3-1 | Ag | 45 | 36 | 1.00E−05 | 18.2 | Bad |
| spl-3-2 | Ag | 40 | 55.6 | 9.80E−06 | 17.2 | Good |
| spl-3-3 | Ag | 30 | 92.2 | 8.50E−06 | 15.7 | Good |
| spl-3-4 | Ag | 20 | 135.5 | 7.00E−06 | 15.2 | Good |
| spl-3-5 | Ag | 10 | 165.2 | 4.50E−06 | 14.3 | Good |
| spl-3-6 | Ag | 3 | 293.1 | 2.10E−06 | 7.3 | Bad |
| Comparative Example | Commercial Bi type solder | | 35.8 | 3.20E−05 | 16.7 | Bad |

EXAMPLE 3

In this example, bonding of a Cu substrate and an Si semiconductor chip was investigated.

A bonded sample was manufactured by using the glass VTC3-01 manufactured in Example 1 by the following procedures. At first VTC3-01 was pulverized into a fine powder having an average particle diameter of 0.5 μm or less. The pulverized VTC3-01 and an Ag powder were blended at a predetermined ratio and mixed for 1.5 minutes in a mortar to prepare a powder mixture.

(Heat Conductivity and Electric Resistivity)

Various kinds of the powder mixtures were formed each into a molded body of 10 mm diameter and 2 mm thickness. The manufactured molded bodies were sintered in atmospheric air for 350° C.×35 minutes to form simulation samples for evaluating the heat conductivity and the electric resistivity of a third adhesive layer.

The electric resistivity of the sintered sample was measured by using a portable low resistivity meter (Loresta AX; MCP-T370) manufactured by Mitsubishi chemical corporation. Then, the heat conductivity was measured by using the identical sample by the xenon flash method.

(Bonding Strength)

Die bonding material pastes were manufactured each by mixing various kinds of powder mixtures, a resin binder, and a solvent in the same manner as in Example 2. Die bonding material pastes were printed over a ceramic substrate each in a range of 5×5 mm² and, after drying at 150° C., temporarily calcined in atmospheric air for 350° C.×30 minutes. Then, an Si semiconductor chip of a 4×4 mm² size was placed on the die bonding materials, and sintered in atmospheric air for 350° C.×30 minutes while placing a 100 g weight thereon, to form die shear test samples in which the Si semiconductor chip was bonded over the Cu substrate. The bonding strength between the Si semiconductor chip and the Cu substrate was evaluated by a die shear strength test. Table 4 collectively shows the result of evaluation.

In this example, samples having a bonding strength >20 MPa, heat conductivity >50 W/mK, and an electric resistivity <1.0×10⁻⁵ Ω·cm were evaluated as satisfactory.

As can be seen from Table 4, it was shown that the die bonding material of the example can be bonded to a ceramic substrate not having a metallized layer, at high heat conductivity and high bonding strength.

DESCRIPTION OF REFERENCE CHARACTERS 1-1: first member
1-2: second member
2, 15, 18, 21: adhesive member
3: base metal
4: first adhesive member
5: insulation layer
6: second adhesive member
7: metal wiring
8: third adhesive member
9: semiconductor chip
10, 11: metal member
12: fourth adhesive member
13: fifth adhesive member
14: LED mounted substrate
16: LED emission element
17: substrate
19: CPU
20: heat sink
22: chip
23: jig for exclusive use

The invention claimed is:

1. A bonded body in which a first member and a second member each comprising one of metal and ceramic are bonded to each other, wherein
the second member is bonded to the first member by way of an adhesive member disposed on the surface of the first member, the adhesive member contains a $V_2O_5$-containing lead-free glass and metal particles, the metal particles comprise account for 30 to 95 vol % of the adhesive member; and
wherein the lead-free glass comprises 10 to 60 mass % of $Ag_2O$, 5 to 65 mass % of $V_2O_5$, and 15 to 50 mass % of $TeO_2$.

2. The bonded body according to claim 1,
wherein the metal particles comprise account for 60 to 95 vol % of the adhesive member.

3. The bonded body according to claim 2, wherein the metal particles comprise at least Ag.

4. The bonded body according to claim 1, wherein the lead-free glass is less crystalline than amorphous and the rate of crystallization is 30% or less.

5. The bonded body according to claim 1, wherein the metal particles comprise at least Ag or an Sn-containing solder.

6. A bonded body in which a first member and a second member each comprising one of metal and ceramic are bonded to each other, wherein
the second member is bonded to the first member by way of an adhesive member disposed on the surface of the first member, the adhesive member contains a $V_2O_5$-containing lead-free glass and metal particles, the metal particles comprise account for 30 to 95 vol % of the adhesive member; and wherein the lead-free glass comprises 35 to 55 mass % of $V_2O_5$, 15 to 35 mass % of $TeO_2$, 4 to 20 mass % of $P_2O_5$, and 5 to 30 mass % of one or more of $Fe_2O_3$, $MnO_2$, $Sb_2O_3$, $Bi_2O_3$, $K_2O$, and ZnO.

7. A semiconductor module comprising a base metal, a ceramic substrate, a metal wiring, and a semiconductor chip wherein the ceramic substrate is bonded to the base metal by way of a first adhesive member disposed to the surface of the base metal, the metal wiring is bonded to the ceramic substrate by way of a second adhesive member disposed to the surface of the ceramic substrate, the semiconductor chip is bonded to the metal wiring by way of a third adhesive member disposed to the surface of the metal wiring, and the first adhesive member, the second adhesive member, and the third adhesive member each contain a $V_2O_5$-containing lead-free glass and metal particles, the metal particles of the first adhesive member or the metal particles of the second adhesive member each comprise account for 30 to 95 vol % of the first adhesive member or the second adhesive member, the metal particles of the third adhesive member comprise account for 60 to 95 vol % of the third adhesive member.

8. The semiconductor module according to claim 7, wherein the lead-free glass of the first adhesive member, the lead-free glass of the second adhesive member, or the lead-free glass of the third adhesive member comprises 35 to 55 mass % of $V_2O_5$, 15 to 35 mass % of $TeO_2$, 4 to 20 mass % of $P_2O_5$, and 5 to 30 mass % of one or more of $Fe_2O_3$, $WO_3$, $MoO_3$, $MnO_2$, $Sb_2O_3$, $Bi_2O_3$, BaO, $K_2O$, and ZnO.

9. The semiconductor module according to claim 7, wherein the lead-free glass of the first adhesive member, the lead-free glass of the second adhesive member, or the lead-free glass of the third adhesive member comprises 10 to 60 mass % of $Ag_2O$, 5 to 65 mass % of $V_2O_5$, and 15 to 50 mass % of $TeO_2$.

10. The semiconductor module according to claim 7, wherein the $V_2O_5$ is less crystalline than amorphous phase and the rate of crystallization thereof is 30% or less.

11. The semiconductor module according to claim 7, wherein the metal particles of the first adhesive member or the metal particles of the second adhesive member comprise at least one of Ag or an Sn-containing solder.

12. The semiconductor module according to claim 7, wherein the metal particles of the third adhesive member comprise Ag.

* * * * *